United States Patent [19]

Nichols et al.

[11] Patent Number: 5,121,706
[45] Date of Patent: Jun. 16, 1992

[54] APPARATUS FOR APPLYING A COMPOSITE INSULATIVE COATING TO A SUBSTRATE

[75] Inventors: Michael F. Nichols; Allen W. Hahn, both of Columbia, Mo.

[73] Assignee: The Curators of the University of Missouri, Columbia, Mo.

[21] Appl. No.: 586,513

[22] Filed: Sep. 21, 1990

Related U.S. Application Data

[62] Division of Ser. No. 439,491, Nov. 21, 1989, which is a division of Ser. No. 109,079, Oct. 6, 1987, Pat. No. 4,921,723.

[51] Int. Cl.$^5$ .................................. C23C 16/50
[52] U.S. Cl. .................................. 118/719; 118/723
[58] Field of Search ............... 118/715, 723, 719; 427/41, 255.6

[56] References Cited

U.S. PATENT DOCUMENTS

| | | | |
|---|---|---|---|
| 4,072,769 | 2/1978 | Lidel | 427/40 |
| 4,366,184 | 12/1982 | Auerbach | 427/41 |
| 4,618,507 | 10/1986 | Sadhir | 427/41 |
| 4,673,589 | 6/1987 | Standley | 427/41 |
| 4,683,143 | 7/1987 | Riley | 427/255.6 |
| 4,692,347 | 9/1987 | Yasuda | 427/41 |
| 4,810,524 | 3/1989 | Nakayama | 427/41 |

OTHER PUBLICATIONS

Yasuda, Distribution of Polymer Deposition in Plasma Polymerization, II. Effect of Reactor Design, Journal of Polymer Science: Polymer Chemistry Edition, vol. 16, (1978) pp. 313-326.

Primary Examiner—Richard Bueker
Attorney, Agent, or Firm—Senniger, Powers, Leavitt & Roedel

[57] ABSTRACT

A process for applying an adherent electrically insulative moisture-resistant composite coating to a substrate. A thin, adherent, highly cross-linked, substantially liquid moisture-impervious primer coating is provided on the substrate by glow discharge polymerization of a low molecular weight hydrocarbon monomer in a low pressure chamber containing the substrate, the monomer being selected from among methane, ethane, propane, ethylene, and propylene. A second polymeric coating layer is provided over the primer coating by glow discharge polymerization of a second precursor comprising a hydrocarbon or substituted hydrocarbon. The precurser exhibits a hydrogen yield of not greater than about 0.75 hydrogen atoms per molecule under the glow discharge polymerization conditions under which the second layer is deposited, whereby the second polymeric coating layer is substantially resilient and strongly bonded to the primer coating and the second layer comprises a high concentration of surface and bulk free radicals. An article produced by the process and an apparatus for carrying out the process are also disclosed.

1 Claim, 6 Drawing Sheets

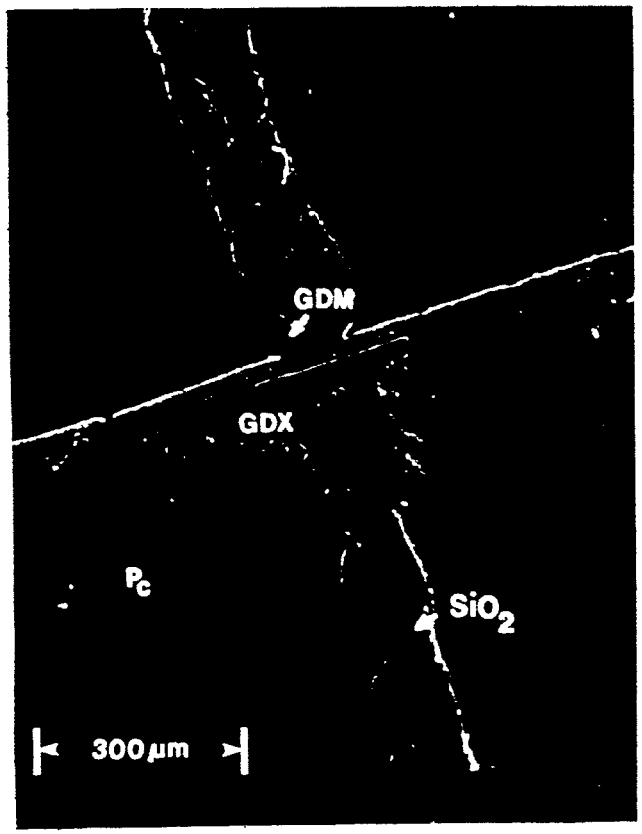
FIG. 9
FIG. 10
GDM/GDX/Pc INSULATION VS. ADHESION FOR COMB STRUCTURES
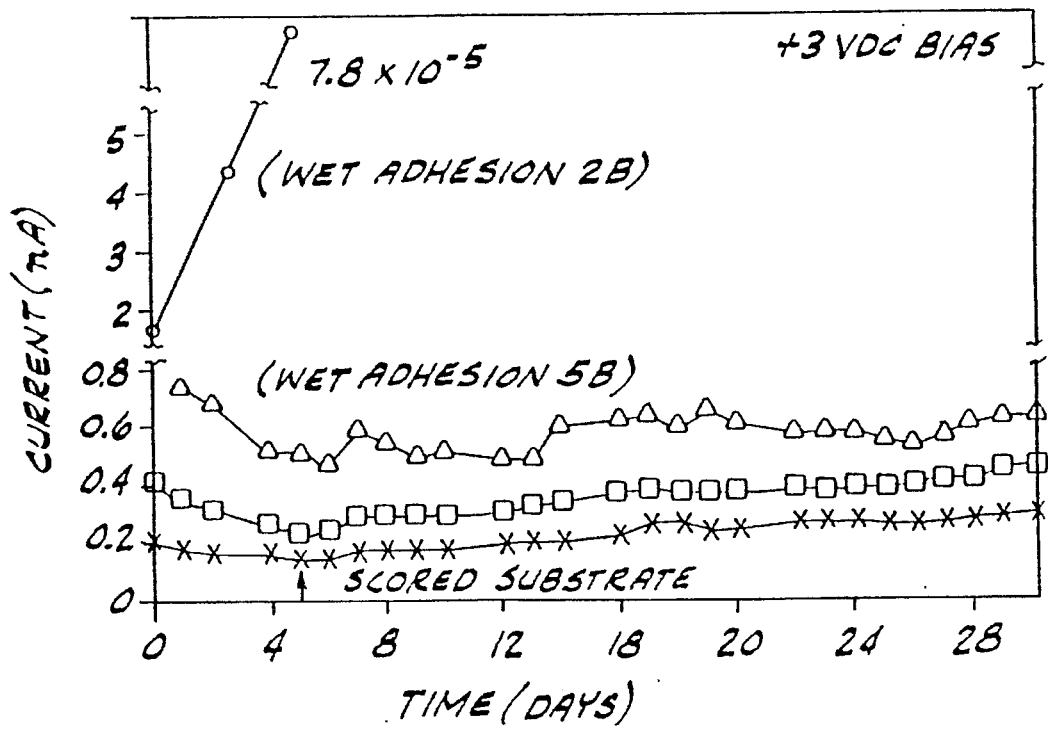

APPARATUS FOR APPLYING A COMPOSITE INSULATIVE COATING TO A SUBSTRATE

This is a division of application Ser. No. 439,491, filed Nov. 21, 1989, which is a division of application Ser. No. 109,079, filed Oct. 16, 1987, now U.S. Pat. No. 4,921,723.

BACKGROUND OF THE INVENTION

This invention relates to the provision of insulative protective coatings on substrates, and more particularly to a novel process for providing a tough, thin, adherent, insulative coating that constitutes a barrier against penetration of liquid water and ions to the surface of the substrate.

Numerous applications require protection of a substrate against contact with liquid water, ions or ionizable species. In many mechanical or electrical devices, contact of the surface with moisture may cause galvanic corrosion. In electrical devices such as integrated circuits, protection of the substrate surface from moisture may be essential to prevent the generation of stray current paths which may result in short-circuiting of the device.

Insulative or other protective materials which work well in dry air are often inadequate in high humidity or liquid environments. Both corrosion and electrical breakdown problems are exacerbated if a device is exposed to water that contains inorganic ions. One particularly difficult and sensitive application of integrated circuits, semiconductors and metal electrodes is in electrical or electronic device implantation in a human or animal body. Extra-cellular fluids within the body are saline, and often contain a number of other ions or other electrolytes. At body temperatures, severe and rapid corrosion may lead to rapid and untimely failure of the device. Short of corrosive failure, the operation of the device may be disturbed by stray currents in a manner which can, in some instances, be catastrophic to the host.

Various materials have been developed to provide an electrically insulative moisture barrier over a substrate. Among the more prominent of these are aromatic polyimides such as those sold under the trade designation "Kevlar" by E. I. DuPont de Nemours, & Co. However, polyimides must be applied by wet processes such as deposition from organic solution, requiring the handling, recycle, and/or disposal of organic solvents, and thus implicating the materials cost, environmental control, and capital and operating costs that attend solvent deposition processing. Moreover, polyimide coatings must be cured by baking, and the polyimide coating process generally requires close control of process parameters.

Another group of materials which have good insulative properties and reasonably good resistance to moisture penetration are the vapor deposition polymers referred to as parylenes. Parylene N coatings are produced by vaporizing a di(p-xylylene) dimer, pyrolyzing the vapor to produce p-xylylene free radicals, and condensing a polymer from the vapor onto a substrate that is maintained at a relatively low temperature, typically ambient or below ambient. Parylene N is derived from di(p-xylylene), while parylene C is derived from di(-monochloro-p-xylylene), and parylene D is derived from di(dichloro-p-xylylene).

Although parylenes have generally advantageous electrical, chemical resistance and moisture barrier properties, it has been found that these polymers do not adhere well to many substrate surfaces, particularly under wet conditions. Although these polymers are quite resistant to liquid water under most conditions, they are subject to penetration by water vapor which may condense at the interface between the parylene film and the substrate, forming liquid water which tends to delaminate the film from the substrate. Vapor deposited parylene films are also generally quite crystalline and are subject to cracking which may also create paths for penetration of moisture to the substrate surface.

Substantial efforts have been made in the art to devise means for pre-treating a substrate to enhance adherence to subsequently applied parylene. Other work has related to the treatment of a pre-formed parylene film to improve its adhesiveness to another surface to which it is subsequently mated.

One factor which has reportedly affected the adherence of parylene is the hydrophobicity of the substrate. Certain of the work previously conducted in this art has involved plasma treatment of the substrate, which has been found to render the substrate more susceptible to adhesion of subsequently applied vapor deposited parylene. As found, for example by Sharma et al., "Effect of Surfce Energetics of Substrates on Adhesion Characteristics of Poly-p-xylylenes", *J. Adhes.*, 1982, 13(3-4), 201-14, glow discharge treatment of a glass surface with an argon or methane plasma reduces the surface energy and leaves the substrate surface in a hydrophobic conditon. Sharma et al. suggest the application of a glow discharge polymerized methane primer coating to the substrate prior to vapor deposition of the poly-p-xylylene. They also investigated preliminary glow discharge treatment of the surface with either argon or oxygen, but found treatment with methane plasma to be the most effective. Oxygen plasma treatment was found to render the surface hydrophilic and was detrimental to adhesion. In the course of Sharma et al.'s experimental work, the walls of the reactor became coated with parylene and some of this material was sputtered off and deposited on the substate during plasma tratment. However, this effect was reported to be much less pronounced during treatment with methane than with argon.

Sharma et al, "Effect of Glow Discharge Treatment of Substrates on Parylene-Substrate Adhesion", *J. Vac. Sci. Technol.*, 21(4), Nov./Dec. 1982 also describes the pretreatment of metal and glass surfaces with argon, oxygen or methane plasma prior to the vapor deposition of poly-p-xylylene Consistent with the findings reported in the *J. Adhes.* article discussed above, the authors in the *J. Vac. Sci. Technol.* article found that treatment with methane plasma was the most effective for wet and dry adhesion of parylene, and that oxygen treatment was undesirable for such purpose. It was reported that treatment with methane plasma resulted in the formation of a thin hydrophobic glow discharge polymerized layer on the substrate, and that this layer contained free radical sites for covalent bonding with the parylene. It was further pointed out that provision of a glow discharge polymerized methane primer coating could be effected in the same vessel in which the vapor deposition of parylene takes place. Wet and dry adhesion tests were reported for various nonporous substrates, including poly(tetrafluoroethylene), polypropylene, polyethylene, poly(methyl methacrylate), poly(ethylene terephthalate), nylon-6, and glass, and certain porous substrates, including "Gorotex" and "Millipore" (0.25 micron). Porous substrates showed enhanced adhesion due to penetration of the polymer coating into the pores, and mechanical interlocking of the polymer film with the pores of the substrate. Plasma treated platinum foil was subjected to Auger analysis to provide information relating to the composition of the treated surface.

Nichols et al, "Evaluating the Adhesion Characteristics of Glow-Discharge Plasma-Polymerized Films by a Novel Voltage Cycling Technique", *J. Appl. Polymer Sci.: Applied Polymer Symposium*, 38, 21-33 (1984) describes the use of modified cyclic voltammetry techniques to test the adhesion of parylene films to substrates. In applying the parylene films to the substrates, the authors subjected the substrate to plasma pretreatment. Cyclic voltammetry tests verified that the use of primer coatings of glow-discharge polymers improved the adhesion of parylene films to platinum substrates. This article further states that previously used tests, such as pull rod tests, had been carried out on relatively large substrates, and are substrate and geometry dependent. The cyclic voltammetric test was developed to provide more reliable test data for coatings on micronsize wire probes such as might be used for stimulating and/or recording neural electrodes.

While the deposition of a primer coating by glow discharge polymerization of methane has thus been shown to provide a material improvement in the adhesion of parylenes to various substrates, it has further been found that such a primer is not, by itself sufficient to provide completely reliable long-term adhesion for parylene coatings on such products as implantable electrodes or integrated circuits. The glow discharge poly(methane) layer is very densely crosslinked, which tends to make it exceptionally resistant to moisture condensation. However, the glow discharge polymerized poly(methane) (GDM) layer is also necessarily very thin, which allows paths for tunnelling currents to penetrate to the substrate surface. Moreover, because of its high cross-linking density, the GDM layer is highly stressed internally. Consequently, if the thickness of the glow discharge GDM layer is increased beyond about 50 angstroms, it tends to crack or craze, leaving paths both for passage of current and penetration of ions and liquid water. Furthermore, despite the report of the Sharma et al *J. Vac. Sci. Technol.* that GDM provides free radical sites for the bonding of a subsequently applied parylene coating, the free radicals at the free surface of a methane glow discharge polymer film are relatively few in number and tend to be extinguished by reaction with each other and atmosphere oxygen. Accordingly, the density of free surface and bulk free radicals in a GDM primer coating is not high to begin with, and decays rapidly with time or exposure to air. As a result, the bonding strength between the GDM and vapor deposited parylene layers is not exceptionally high, and the mean distance between interfacial free radical bonds may be larger than the dimensions of integrated circuit components, so that ion-containing condensed phase water may coalesce to droplet sizes large enough to cause stray currents on, along, or across components on the substrate surface. Thus, encapsulation of an implantable electrode or integrated circuits by application of a GDM primer, followed by vapor deposition of parylene, has not been demonstrated to reliably provide for long term operation in the presence of extra-cellular fluids.

In the work described in the above referenced articles, the glow discharge polymerization was carried out in an audio to radio frequency field established by capacitance coupling using aluminum electrode capacitors. In such a system, the electrodes of the capacitor are conventionally located inside the glow discharge polymerization chamber. As a result, aluminum metal is sputtered off the surface of the electrodes and deposited with the GDM on the surface of the substrate to be coated. This phenomenon has so characterized the capacitance coupled glow discharge research work that it led to the question of whether the presence of the aluminum in the coating film might be a critical contributor to the high degree of adhesion of the GDM to the underlying substrate, particularly in the case where that substrate is an inorganic material. H. Yasuda, *Plasma Polymerization*, Academic Press (1985), pp. 193-194. However, whatever its effect may have been on adhesion, the presence in the coating of aluminum, a highly conductive material, is not desirable where the substrate comprises an electrode, integrated circuit, or other electronic component.

SUMMARY OF THE INVENTION

Among the several objects of the present invention, therefore, may be noted the provision of an improved process for providing an insulative, moisture resistant coating on a substrate; the provision of such a process which provides an insulative coating having a high degree of heat stability; the provision of such a process which is effective for encapsulating and protecting substrates which are exposed to highly humid and corrosive environments; the provision of such a process which is effective for encapsulating of electrodes, integrated circuits, semi-conductors and other electronic components; the provision of such a process which may be used to protect implantable electrodes, circuits and components from extra-cellular fluids; the provision of a novel coated substrate in which the coating is highly insulative and resistant to liquid moisture penetration; and the provision of a novel apparatus for depositing a composite insulative coating on a substrate.

Briefly, therefore, the present invention is directed to a process for applying an adherent, electrically insulative, moisture-resistant composite coating to a substrate. In the process, a thin, adherent, highly cross-linked, substantially liquid moisture-impervious primer coating is provided on the substrate by glow discharge polymerization of a low molecular weight hydrocarbon monomer in a low pressure chamber containing the substrate. The monomer is selected from the group consisting of methane, ethane, propane, ethylene and propylene. A second polymeric coating layer is applied over the primer coating by glow discharge polymerization of a precursor compound in low pressure chamber. The second precursor compound comprises a hydrocarbon or substituted hydrocarbon which exhibits a hydrogen yield of not greater than about 0.75 hydrogen atoms per molecule under the glow discharge conditions under which the second coating layer is applied. The second polymeric coating layer is substantially resilient and strongly bonded to the primer coating, and the second layer comprises a intermediate to high concentration of 3urface and bulk free radicals.

The invention is also directed to a process for applying an adherent, electrically insulative, moisture-resistant coating to a substrate, in which the substrate is first treated with an inert gas plasma to acitivate its surface. Thereafter, a polymeric coating layer is applied over the activated surface by glow discharge polymerization of a precursor compound in low pressure chamber. The precursor compound comprises a hydrocarbon or substituted hydrocarbon which exhibits a hydrogen yield of not greater than about 0.75 hydrogen atoms per molecule under the glow discharge polymerization conditions. The polymeric coating is substantially resilient and strongly bonded to the activated substrate surface and comprises an intermediate to high concentration of surface and bulk free radicals.

The invention is further directed to an article comprising a substrate having an adherent, insulative, moisture-resistant composite coating thereon. The composite coating comprises a thin, adherent, highly cross linked, substantially liquid moisture-impervious primer coating on the substrate and a second coating over and strongly bonded to the primer coating. The primer coating comprises a glow discharge polymer of a low molecular weight hydrocarbon monomer selected from the group consisting of methane, ethane, propane, ethylene and propylene. The second coating layer is substantially resilient and comprises a second glow discharge polymer which comprises an intermediate to high concentration of surface and bulk free radicals. The second glow discharge polymer is produced by polymerization of a second precursor compound selected from among hydrocarbons and substituted hydrocarbons which exhibit a hydrogen yield of not greater than about 0.75 hydrogen atoms per molecule under the glow discharge conditions under which the second coating layer is applied.

The invention is further directed to an article comprising a substrate having an adherent, insulative, moisture-resistant coating thereon. The substrate comprises an active surface that has been treated with an inert gas plasma. Over and strongly bonded to the activated surface of the substrate is a polymeric coating layer that is substantially resilient and comprises a glow discharge polymer which comprises an intermediate to high concentration of surface and bulk free radicals. The glow discharge polymer is produced by polymerization of a precursor compound selected from among hydrocarbons and substituted hydrocarbons which exhibit a hydrogen yield of not greater than about 0.75 hydrogen atoms per molecule under the glow discharge conditions under which the polymeric coating layer is applied.

The invention is further directed to an apparatus for deposition of a composite polymeric coating on the surface of a substrate. The apparatus comprises a polymerization chamber, means within the polymerization chamber for support of the substrate, inlet means for delivery of the glow discharge polymerization monomer gas to the polymerization chamber, means for applying a vacuum to the polymerization chamber, reactance coupling means outside the polymerization chamber for establishing a glow discharge zone within the chamber, whereby a glow discharge polymer primer coating may be applied to the substrate, means outside the polymerization chamber for vaporizing the precursor of a vapor deposition polymer, a pyrolysis chamber having an inlet in communication with the vaporization means and an outlet in communication with the polymerization chamber, means for heating the vaporized precursor for pyrolysis thereof within the pyrolysis chamber, and means for controlling the temperature of the substrate at a temperature adapted for condensation of a polymer from the pyrolyzed vapor, the respective orientation of said pyrolysis chamber, said outlet from said pyrolysis chamber into said polymerization chamber, said support means, and said reactance coupling means being such that precursor vaporized by said vaporization means may be deposited either by glow discharge polymerization or vapor deposition polymerization over the primer coating on said substrate.

Other objects and features will be in part apparent and in part pointed out hereinafter.

BRIEF DESCRIPTION OF THE DRAWING

FIG. 9 is an SEM photomicrograph similar to FIG. 7 but illlustrating adhesion after subjection of the composite film to repetitive alternating pull testing and boiling in physiological saline solution over a period of 15 hours; and FIG. 10 is a plot of current vs. time in leakage current tests carried out on various substrates provided with composite coatings in accordance with the invention.

DESCRIPTION OF THE PREFERRED EMBODIMENTS

In accordance with the invention, it has been discovered that substantially enhanced wet and dry adherence of insulative coatings can be provided by sequential application of, first, a glow discharge polymer primer layer from a monomer having a relatively high hydrogen content, and then another glow discharge polymer coating layer from a monomer or other precursor having a relatively low hydrogen yield. Preferably, a third coating layer is provided as a cap over the second layer to provide a relatively hard, smooth, chemically inert outer surface. Because of the high bulk and free surface concentration of free radicals in the second layer, it tends to interact with other objects and surfaces with which it comes into contact. Moreover, in some instances, for example, where the second layer is derived from a vapor deposition precursor such as a p-xylylene dimer, unreacted precursor contained in the second layer may tend to leach out unless there is a relatively impervious outer coating.

Figure 1:
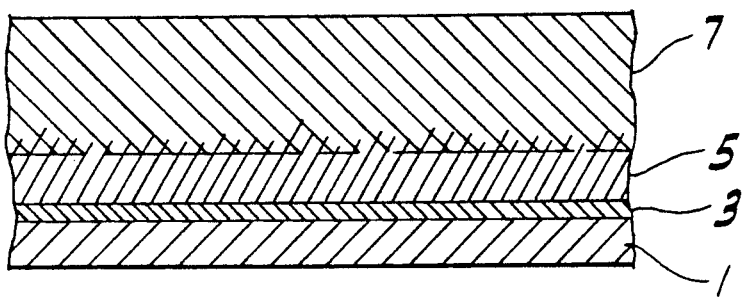
FIG. 1 is a cross sectional view illustrating the coated substrate of the invention.

Illustrated in FIG. 1 is a cross-section of a preferred form of the coated substrate of the invention. Shown at 1 is the substrate and at 3 the glow discharge polymer primer coating. Within the primer at the interface between substrate and primer is a densely crosslinked marginal stratum which is attached to the substrate through covalent bonds derived from the free radicals generated through glow discharge treatment of the substrate by the primer layer. In the case, for example, where the substrate is glass, the primer is bonded to the substrate through both C—O and C—Si bonds. Over and bonded to primer coating 3 in FIG. 1 is the second layer 5, in this instance an intermediate coating layer bonded on its outside surface to an outer coating layer 7. Layer 5 is resilient and thread-like, and has a high density of bulk and surface free radicals, through which it is very strongly bonded to both the primer and outside coating layers. While densely cross-linked, primer layer 3 is sufficiently thin so that it is not subject to the crazing and cracking to which this type of glow discharge polymer otherwise tends to be susceptible. The outer coating 7, typically a vapor deposited parylene, may be highly crystalline, but the resilient nature of the second layer 5 acts as a cushion or dash pot which absorbs the shock of hydration and thermal stresses and preserves the mechanical integrity of the composite coating film.

A very wide range of substrates may be provided with a composite coating in accordance with the instant invention. Almost any organic or inorganic solid material may be suitable as a substrate, including metal, glass, ceramic semiconductors, rubber, natural and synthetic resins, etc. Particularly advantageous applications include coating of metal electrodes, integrated circuits, and the like. The process of the invention is especially suited for encapsulation of electrode and electronic components adapted for implantation in the body and exposure to extracellular body fluids.

In application of the primer coating to the substrate, the monomer utilized is preferably a hydrocarbon, and should have a high ratio of hydrogen to carbon as indicated above. Generally, low molecular weight alkanes such as methane, ethane and propane are preferred, though ethylene and propylene can also be used. Most preferred as the glow discharge polymerization monomer for the primer coating is methane, which has a maximum hydrogen to carbon ratio and thus yields a high concentration of hydrogen and free radicals in the glow discharge plasma. This produces a highly cross-linked glow discharge polymer film that is strongly adhered to the substrate by covalent bonding and atomic interfacing mixing as effected by a high concentration of free radicals at the substrate/polymer interface.

In carrying out the glow discharge polymerization, the polymerization vessel is first evacuated, and then flow of monomer or other precursor gas commenced. Using a mechanical vacuum pump, the pressure is preferably reduced to about $10^{-4}$ torr before monomer flow starts. When monomer gas is admitted to the reactor, the pressure typically rises to the range approaching $10^{-2}$ torr, preferably not more than $5-9 \times 10^{-3}$ torr. Once the flow of monomer gas has commenced, power is applied to a capacitor or inductance coil to establish by reactance coupling a glow discharge zone within which polymerization then takes place. Upon application of power, the pressure in the glow discharge zone typically rises to the range of between about $1.2-1.6 \times 10^{-2}$ torr. Reaction continues under controlled power and flow conditions until the desired thickness of primer coating has been obtained. Preferably, the reaction is controlled to avoid sharp increases in pressure. Some pressure increase is unavoidable, however, since hydrogen is released during the polymerization and cannot be removed by a mechanical vacuum pumping. Frequently, some adjustment in power input is made during the reaction to limit the extent of pressure changes.

Adhesion of the primer coating to the substrate has been found to be a function of the power input, monomer flow rate, and average plasma gas molecular weight. Contrary to earlier speculation in the art, it has been found that adhesion of the glow discharge polymer to the substrate does not depend on the presence of aluminum or other ablated material in the coating film. Since aluminum or other metal may have undesirable effects on the electrical or other properties of the glow discharge film, the process of the invention is preferably operated to minimize the inclusion of sputtered metal of such type. In order to achieve this result, the glow discharge polymerization process for application of the primer coating is preferably carried out on an electrodeless basis, i.e., without the presence of capacitor electrodes inside of the glow discharge polymerization vessel. Most preferably, the glow discharge zone is established by inductive coupling using a coil surrounding and outside of the polymerization vessel. Alternatively, the zone may be created by capacitative coupling using capacitor electrodes located outside of the vessel.

Figure 3A:
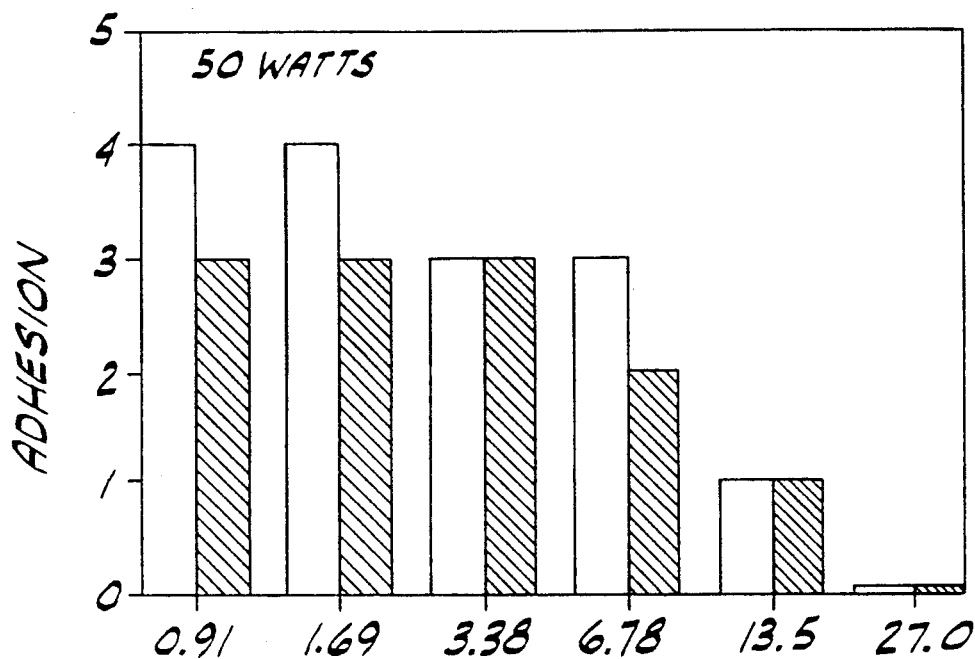
FIGS. 3 a-c are plots of adhesion of a glow discharge polymer to a substrate as a function of W/FM at constant FM.
Figure 3B:
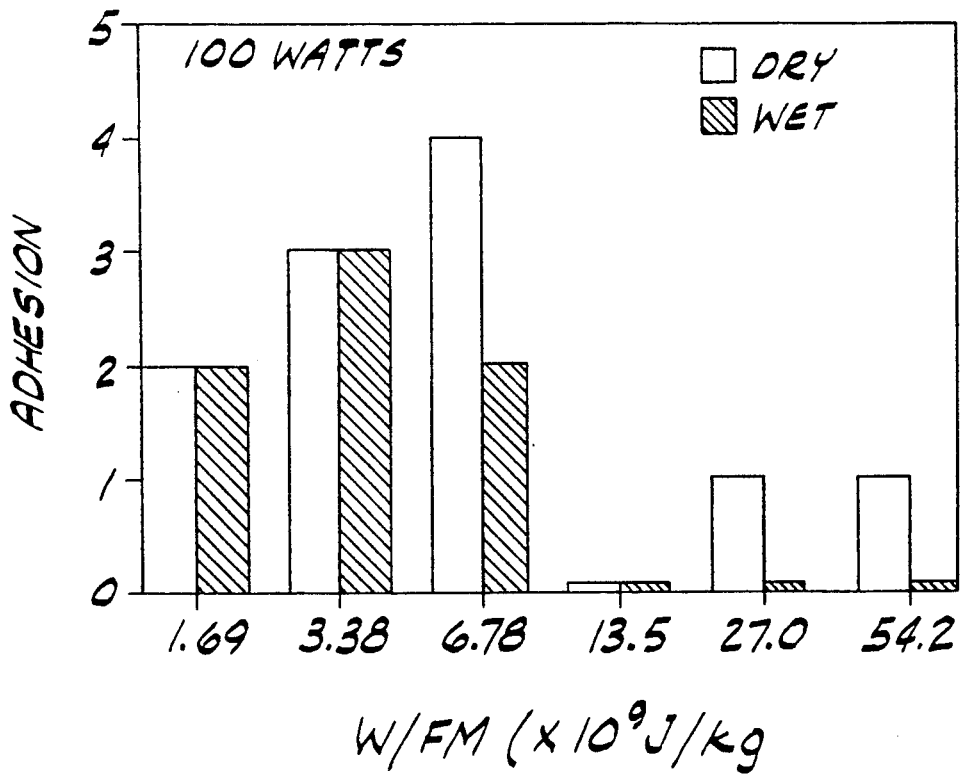
Figure 3C:
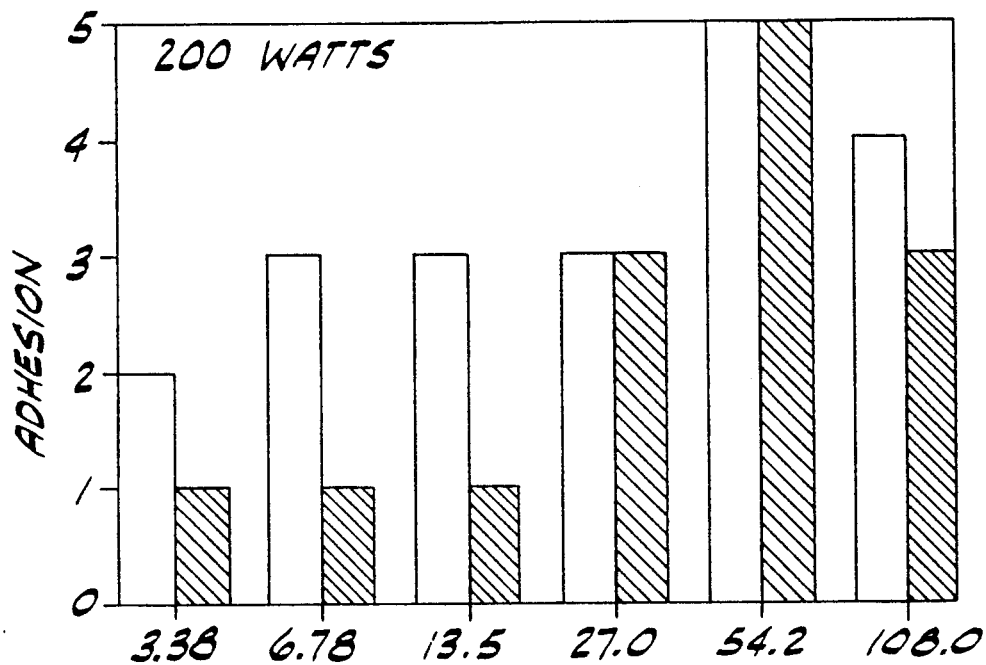

More particularly, it has been found that, in application of the glow discharge polymer primer coating, adhesion of the coating to the substrate is affected by the parameter: where W is the power input per unit volume of the glow discharge zone, F is the monomer flow rate, and M is the average molecular weight of the glow discharge plasma. It has been discovered that, at a given power input, adhesion is a generally increasing function of W/FM, so that this parameter should be established at a relatively high level, typically in the range of between about $5 \times 10^9$ and about $500 \times 10^9$ joules/kg of plasma gas. However, at constant values of FM, the adhesion of the glow discharge polymer goes through a maximum, and then begins to decrease, so that there is an optimum power input. This relationship is generally illustrated in FIG. 3. For the monomers and flow rates typically involved in the deposition of the primer coating layer, the power input flux average is preferably between about 1.5 and about $15 \times 10^{-2}$ watts/cm$^3$, preferably between about 5 and about $10 \times 10^{-2}$ watts/cm$^3$, in the glow discharge zone.

Figure 4:
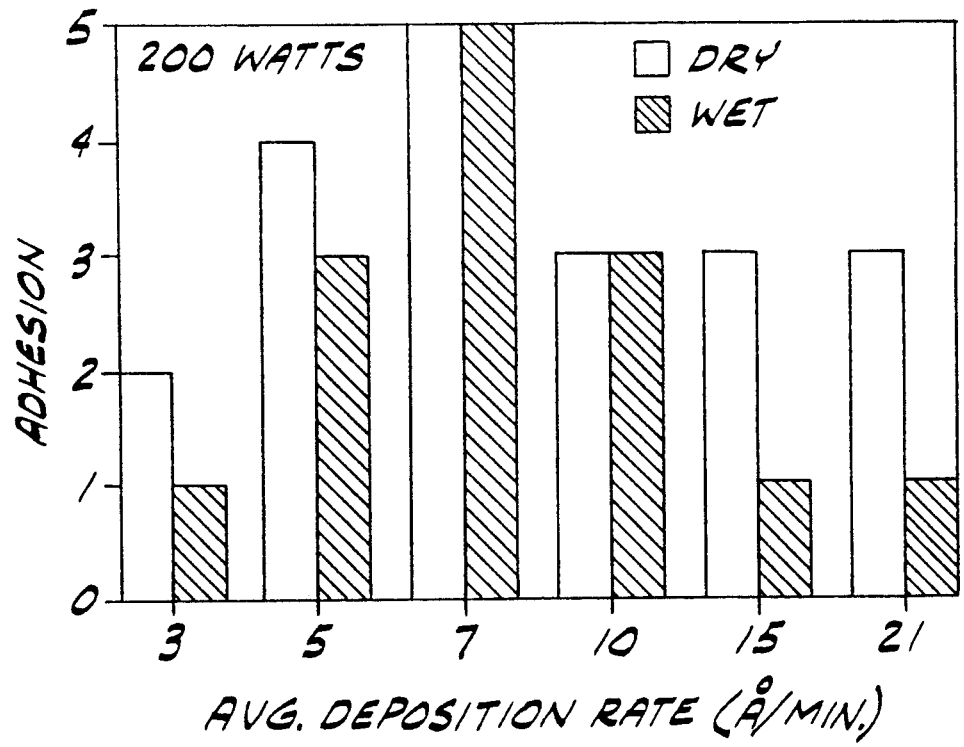
FIG. 4 is a plot of adhesion of a glow discharge polymer to a substrate as a function of deposition rate.
Figure 5:
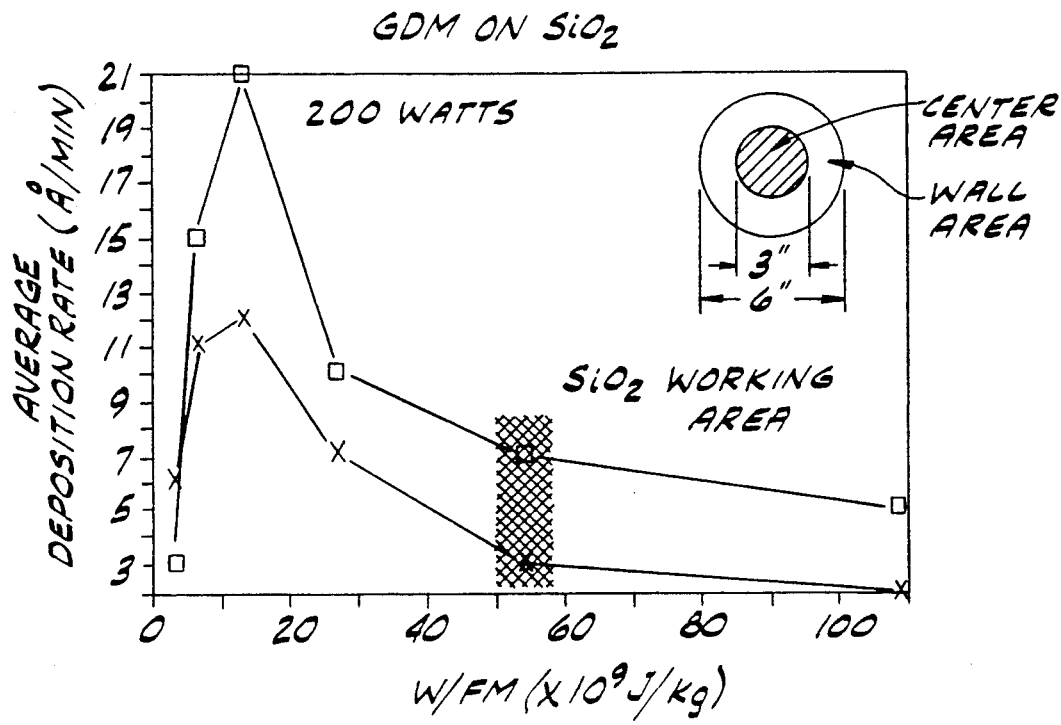
FIG. 5 is a plot of deposition rate vs. W/FM for the glow discharge polymerization of methane in an $SiO_2$ substrate, indicating the region of operation for optimal adhesion of glow discharge polymer to substrate.

To an extent, adhesion can be promoted by use of a relatively low flow rate and a consequently low deposition rate. It has further been found that adhesion is promoted by controlling the average molecular weight of the glow discharge zone plasma at a relatively low level. Both of these factors have the effect of increasing the value of W/FM at constant power input. However, as in the case of increasing power input, there is a limit to the benefit to be realized from decreasing monomer flow rate. At some point, of course, it seriously affects productivity; and also polymer composition. However, as illustrated in FIG. 4, it has further been found that an optimum is exhibited in the relationship between adhesion and glow discharge polymer deposition rate. Generally, therefore, the monomer flow should be maintained at a rate of at least about 0.10 standard cc per cubic centimeter of glow discharge polymerization zone volume per minute. Optimum adhesion on $SiO_2$ is normally obtained at a deposition rate of between about 5 and about 9 angstroms per minute. FIG. 5 contains plots of deposition rate against W/FM for both the center region and wall region of the reactor. The shaded area on FIG. 5 shows the optimum range of conditions for glow discharge polymerization on the $SiO_2$ substrate.

The inverse relationship between adhesion and molecular weight of glow discharge plasma gas provides another idication of the desireability of methane as the glow discharge monomer. However, it has been found that a further incremental improvement in adhesion may be achieved by bleeding a low molecular weight inert diluent gas, such as helium or neon, into the glow discharge zone to further lower the average molecular weight of the glow discharge plasma. It is important, however, that oxygen be carefully excluded from the glow discharge zone since it is a free radical scavenger, tends to be reactive with the substrate and glow discharge polymer, and produces a primer coating which is hydrophilic.

As noted, the primer produced by glow discharge polymerization has a high density of cross-linking. Physically, it is a relatively high density material, having a typical specific gravity in the range of about 1.2-1.34. Although bound tightly to the surface by atomic inter-facial mixing, and by covalent bonds deriving from the presence of free radicals in the plasma, the glow discharge polymer primer film of methane does not have an especially high concentration of bulk free radicals. A low bulk free radical content generally equates to a low concentration of free radicals at the free surface of the glow discharge polymer film, the free radicals of the plasma being largely extinguished by cross-linking in the film and bonding to the substrate. In order to prevent cracking or crazing of the primer film, it is preferably applied to a thickness of not more than about 300 angstroms. On the other hand, the thickness should be at least about 30 angstroms to inhibit tunnelling currents. An optimum thickness may typically be in the range of 30-100, preferably 45-60, angstroms.

In application of the second coating layer, the monomer or other precursor is preferably an organic compound, typically a hydrocarbon, which exhibits a hydrogen yield of not greater than about 0.75 hydrogen atoms per molecule under the glow discharge conditions under which the second coating is applied. It has been found that such relatively low hydrogen yield conduces to deposit of a layer which has a high concentration of residual bulk and surface free radicals, thereby promoting the adhesion of the layer to both the underlying primer coating and to any top coating which is applied subsequently. FIG. 5 illustrates generally the relationship between hydrogen yield of the glow discharge polymerization precursor and the bulk free radical content of the polymer. Aromatic, substituted aromatic heterocyclic and acetylenic compounds generally are suitable as precursors for the glow discharge polymerized second layer. Olefins such as propylene, butane or hexene may also be used. Among the preferred precursors are benzene, toluene, xylene, pyridine, furan, indole, and the like. A particularly preferred precursor is a di(p-xylene) or di(chloro-p-xylene) dimer of the type that is used in vapor deposition of parylene films. Propylene is a relatively inexpensive monomer that is satisfactory in at least some applications.

Figure 2:
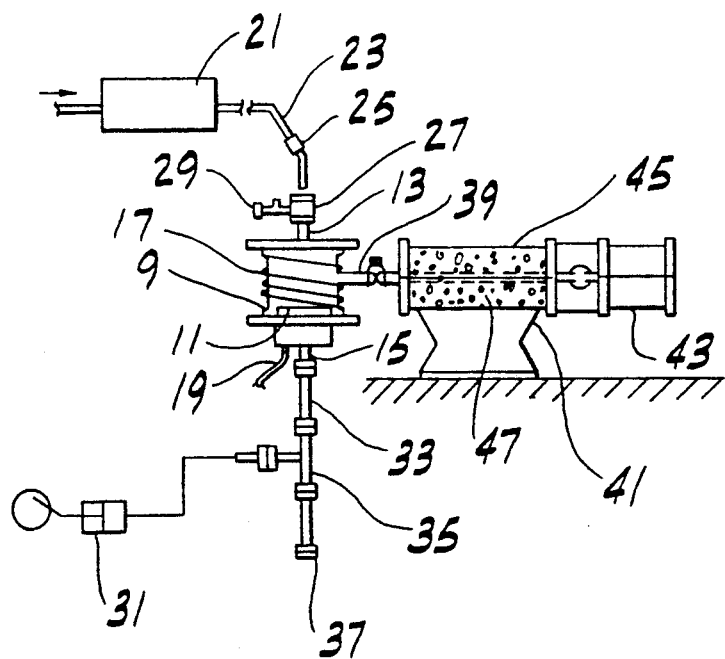
FIG. 2 is a schematic drawing illustrating the apparatus of the invention.
Figure 6:
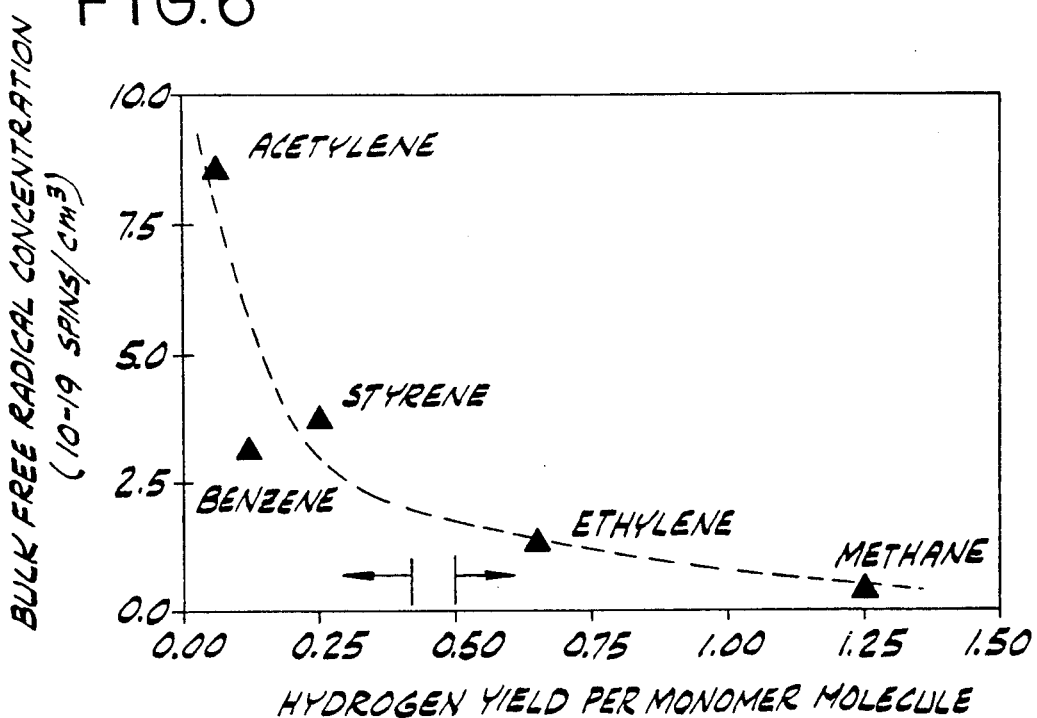
FIG. 6 is a plot of free radical content of a glow discharge polymer as a function of the hydrogen yield of the glow discharge monomer or other precursor compound.

Another criterion for selection of the monomer for the primer coating monomer and second layer precursor may be based on the classification established by Yasuda, *Plasma Polymerization*, Academic Press, 1985 FIG. 6-2 of that work, which is expressly incorporated herein by reference, plots hydrogen yield vs. number of hydrogens per multiple bond and/or cyclic structure or carbon, and identifies three separate groups of monomers, the co-ordinates for monomers of each group falling roughly on a curve which is vertically displaced from the curves for the other two groups. Each of these curves may be characterized by the value of hydrogen yield (vertical axis) for a given value of number of hydrogen atoms, etc. (horizontal axis). Conveniently, each group may be defined by the point along the vertical axis at which the the curve for that group intercepts a vertical line passing through 5 on the horizontal axis. The number of hydrogen atoms, etc.=5 intercept is chosen instead of the y-axis intercept because of nonlinearity in one of the curves as it approaches the y-axis. In accordance with this selected definition, the monomers of Group I may be characterized by an intercept of about 0.25, the monomers of Group II by an intercept of about 0.75, and the monomers of Group III by an intercept of about 1.4. Generally, it has been found that the monomers of Group III are suitable for formation of the glow discharge polymer primer layer, while the monomers of Groups I or II may be used in glow discharge polymerization to form the second coating layer.

Considerations affecting the selection of process conditions for the glow discharge formation of the second layer are comparable to those which govern the glow discharge polymerization which forms the primer layer. In the case of the second layer, it is preferred that the parameter W/FM be in the range of between about $2 \times 10^9$ and about $60 \times 10^9 J/Kg$. Preferably, polymerization is carried out until the thickness of the second layer is in the range of between about 50 and about 500 angstroms, the most preferred thickness depending in part on whether the second layer serves also as the outside layer, or whether a capping layer is applied thereover.

The bulk and surface free radical content of the second layer is preferably in the range of between about $2 \times 10^9$ and about $10 \times 10^{19}$ spins/cm$^3$. This assures a high degree of adhesion of this layer to both the primer layer and to any capping layer that may be applied. Although the second layer has a degree of water absorptivity, it is isotropic with respect to such property, thereby preventing excessive stresses in the film structure due to accumulation of moisture and constraint in its ability to diffuse. In combination with the underlying highly cross linked primer coating, the second layer forms a composite which provides an effective barrier to passage of liquid moisture and ions. As such, this composite provides a highly insulative coating for purposes of encapsulating substrates which comprise electrodes, integrated circuits and other electronic components. Another significant property of the second layer is its substantial resilience. It thus may be applied in thicknesses sufficient to provide insulative and moisture barrier protection, yet remain resistant to failure by impact or other applied stress. Additionally, it may serve as a cushioning layer for a relatively crystalline outer coating layer such as, for example, a vapor deposited parylene or a glow discharge polymerized alkane.

In order to maximize the adhesion between primer and second layers, it is strongly preferred that oxygen gas be excluded during the deposition of the second layer. In a particularly preferred embodiment of the process of the invention, the second layer is applied in the same polymerization vessel as the first, without removal of the primer-bearing substrate between polymerization operations. For best adhesion, application of the second layer immediately follows, most preferably overlaps, i.e., is partially concurrent with, the deposition of the primer. By such technique, the second layer is formed onto a freshly deposited primer layer whose bulk and surface free radical content has not had opportunity to suffer time or environmental decay. As a consequence, there is an exceptional degree of adhesion between the second layer and the primer layer due to atomic interfacial mixing and covalent bonds. Particularly where the second layer is applied from a precursor such as di(p-xylylene), it has been further observed to have a substantially threadlike character, and to provide an interpenetrating network of fibrils extending from and within the primer layer. These fibrils are further observed to terminate in the outer coating layer where that layer is deposited immediately following deposition of the second layer.

A relatively wide variety of materials may serve as the outer coating layer. Thus, for example, another glow discharge polymer of the same type as the primer layer may be applied over the second layer. In such instance the GDM film should be applied to a thickness of at least about 300 angstroms. The outer layer may also be applied by a wet process from a solution of coating material. Aromatic polyimides, for example, may be applied in this fashion to provide a composite coating having advantageous electrical properties and a high degree of chemical resistance. For certain applications, such as in the manufacture of capacitor electrodes, it may be desireable to provide the outer layer by metallizing the second layer, conveniently by metal vapor deposition.

In a particularly preferred embodiment of the invention, however, the third layer is provided by vapor deposition of a polymer such as parylene or polytetrafluoroethylene. Glass, many polymers, or other materials that are sublimable or sputterable to form a film, may also be used. Most advantageously, the third coating is applied by vapor deposition polymerization carried out in the same vessel in which the primer and second layer are deposited, and without removal of the coated substrate from the vessel or exposure of the coatings to air or oxygen. Preferably, maximum adhesion of the outer to the second layer is obtained by carrying out the vapor deposition process immediately after, most preferably overlapping, the glow discharge deposition of the second layer. In this instance, a further convenience is realized if the monomer or other precursor for the outer coating is the same as for the second glow discharge polymer layer. In an especially useful embodiment of the invention, the primer layer comprises a glow discharge polymer derived from an alkane monomer such as methane, the second layer comprises glow discharge polymerized di(p-xylylene) or di(chloro-p-xylylene), and the third and outer layer is produced by vapor deposition of the same dimer that is subjected to glow discharge polymerization for deposit of the second layer.

Conditions used to carry out the vapor deposition polymerization vary somewhat from conventional practice. Sublimation is effected at temperatures somewhat lower than usual in order to match vapor deposition monomer flow rates to glow discharge monomer rates. Pyrolyis temperatures are somewhat higher than usual to assure maximum thermal breakdown and free radical formation. Thus, di(p-xylylene) is vaporized at about 100°–140° C. while di(chloro-p-xylylene) is vaporized at about 100°–140° C. Pyrolysis takes place at a temperature of at least about 640° C., preferably in the range of 640°–740° C. In accordance with conventional practice, the substrate is maintained at relatively low temperature for deposition of the polymer. Parylene C deposits at approximately room temperature, but Parylene N requires refrigeration of the substrate to a temperature of about −50° C. Preferably, the vapor deposited parylene layer is built up to a thickness of at least about ½ micron.

In an alternative embodiment of the process of the invention for protection of certain types of substrates, the primer coating is dispensed with and the surface activated by treatment with an inert gas plasma, e.g., a plasma of argon, neon, nitrogen or the like. This alternative may be followed, for example, with a substrate such as silicon nitride, which is sufficiently activated by u.v. irradiation and ion impact from an inert gas plasma to provide for strong adhesion to a coating corresponding to what is referred to above as the second coating layer. Thus, immediately upon activation, the substrate surface is provided with a glow discharge polymer coating in accordance with the procedure described above for deposition of the second coating layer. Both the selection of precursor compound and the conditions of glow discharge polymerization are governed by substantially the same considerations as discussed above for the formation of the second layer. Deposition of an outer coating also proceeds in the manner described above for application of the third coating layer of FIG. 1. In this instance also, where the outer coating is applied by vapor deposition in the same polymerization vessel in which the glow discharge layer is deposited, it is preferred that there be some overlap between the glow discharge and vapor deposition operations. The article produced in accordance with this embodiment of the invention differs from that of FIG. 1 in lacking the so-called primer coating layer. Although the presence of this primer layer is preferred in many applications, it has been found that activation of the substrate with an inert gas plasma provides a sufficient density of bonding at the interface of certain substrates so that very strong adhesion is achieved between the substrate and the coating layer obtained by glow discharge polymerization from an appropriate precursor, i.e., a compound exhibiting a hydrogen yield of not greater than about 0.75 hydrogen atoms per molecule under the glow discharge polymerization conditions.

Silicon nitride may also comprise the primer layer of a composite coating on a substrate such as silicon or silicon dioxide. In this instance, a composite insulative coating of advantageous properties comprises the combination of silicon nitride and a glow discharge polymer coating layer produced in the manner of the second coating layer as described hereinabove.

In a further alternative embodiment of the invention, a primer coating of the above described type is provided, but the substrate surface is first subjected to treatment with an argon or other inert gas plasma. Optionally, the surface of the primer coating can also be subjected to inert gas plasma treatment prior to glow discharge deposition of the second coating layer, and the latter coating layer may in turn be subjected to inert gas plasma treatment prior to application of the outer coating by vapor deposition or other means.

Illustrated in FIG. 2 is an apparatus uniquely adapted for carrying out the preferred process of the invention. This apparatus comprises a tubular polymerization chamber 9 containing a holder 11 for support of a substrate to be coated. Chamber 9 is oriented vertically and has an inlet nozzle 13 on top thereof for inlet of glow discharge monomer vapor, and/or other plasma gas, and an outlet nozzle 15 on the bottom which provides communication with a vacuum system. A inductance coupling coil 17 is wrapped around the reactor and is connected to a radio frequency power source (not shown) for generation of a glow discharge zone within chamber 9 in the region of holder 11. A cooling line 19 is in communication with a jacket on holder 11 for cooling of the substrate during a vapor deposition reaction. Inlet nozzle 13 is in communication with a source 21 of glow discharge monomer gas via a feed line 23 which contains a submicron filter 25, a bleed valve 27 and a vacuum gauge 29. Outlet nozzle 15 is in communication with a vacuum source 31 via a vacuum line 33 which is connected through a tee 35 to a cold trap 37.

A side nozzle 39 on polymerization chamber 9 is connected to a generator 41 that is adapted for generation of a free radical vapor of the type used in vapor deposition polymerization. Generator 41 includes a sublimation chamber 43 and a pyrolysis chamber 45. Sublimation chamber 43 is provided with a heater effective for vaporization of a di(p-xylylene) or other vapor deposition polymer precursor. Pyrolysis chamber 45 is also provided with a heater which is adapted to heat the precursor vapor to a temperature at which it pyrolyzes to form a free radical-containing vapor. Preferably, the pyrolysis chamber contains packing 47 which serves to avoid streamlining and assure unifrom pyrolysis of the vapor passing through the chamber.

In operation of the apparatus, the polymerization chamber 9 is evacuated, monomer (which may contain a diluent gas) from source 21 is admitted into the chamber via line 23, and power is applied to RF coil 17 to establish a glow discharge zone within the chamber in the vicinity of holder 11. It has been found that particularly advantageous results are achieved if the the location of the substrate on holder 11 is just downstream of coil 17, so that the substrate is downstream of the highest intensity region of the glow discharge zone. After application of the primer coating, or slightly overlapping therewith, the precursor for the second glow discharge polymer layer is admitted into the polymerization chamber. This second precursor may be delivered to line 23 from a second source. Alternatively, the second precursor may be charged to sublimation chamber 43, be vaporized therein, and enter the polymerization chamber through side inlet 39. This alternative is particularly advantageous where the precursor for the second layer is the same material that is subjected to vapor deposition polymerization for application of the outer coating layer. In any event, glow discharge polymerization of the second precursor proceeds in essentially the same fashion as the polymerization which forms the primer coating. After, or slightly overlapping the deposition of the second layer, a third layer may be applied by vapor deposition polymerization. This is effected by vaporizing the precursor in the sublimation chamber 43, passing the vapor through the pyrolysis zone within pyrolysis chamber 45, energizing the heating means in the pyrolysis chamber to form a vapor containing free radicals, and depositing a polymer on the substrate held by holder 11. Cooling water applied through line 19 maintains the temperature of the substrate at a level suitable for the vapor deposition polymerization.

It has been found that the composite coating provided in accordance with the method of the invention exhibits substantially enhance heat stability as compared to parylene films. This is believed to be due in significant part to the presence of aromatic rings in the second or intermediate layer of the composite. An effective increase in glass transition temperature allows the composite to be used at elevated temperatures yet maintain good mechanical properties. Moreover, the composite film provided in accordance with the invention exhibits a synergistic improvement in wet adhesion and resistance to leakage currents as compared to films produced by vapor deposition of parylene over a glow discharge polymerized methane primer. Enhanced adhesion is a result of atomic interfacial mixing and/or other chemical bonding phenomena, not merely to keying of the polymer film to irregularities or pores in the substrate.

As noted, the coated substrate of the invention is uniquely adapted for applications such as implantable electrodes and other electronic devices. However, because of its electrical resistance, moisture resistance, heat stability and other advantageous properties, the composite coating may be used in an exceptionally wide variety of ways. Thus, for example, it may be used as a soil resistant coating for fabrics, as an insulative coating for superconductive materials, as a protective and insulative coating for compact disc sound recordings, in the preparation of metallized films such as those useful in producing electrical condensers, as a material for construction of containers for carbonated beverages, and numerous other applications.

The following examples illustrate the invention.

EXAMPLE 1

A granular di(chloro-p-xyxylene) dimer was carefully weighed into a quartz tube contained in the sublimation zone of an apparatus of the type depicted in FIG. 2. Silicon dioxide substrates to be coated were placed on the support holder located in the glow discharge polymerization chamber. The apparatus was then evacuated to a pressure of less than 1.0 micrometer Hg with the use of a mechanical pump and a liquid nitrogen trap. Methane gas (Matheson CP grade) was used as the initial monomer for forming an adhesive glow discharge primer coating in an RF field of 300 watts at 13 MHz. A constant flow of methane into the chamber was maintained at 0.30 sccm by a MKS[1] 1259B mass flow controller. While the glow discharge polymer of methane (GDM) was forming on the substrates, the pyrolysis zone furnace was brought to 700° C. After a GDM film had formed to a thickness of approximately 5 nm, the temperature of the sublimiation zone furnace was increased to 110° C., thereby releasing the di(-chloro-p-xylylene) vapors from the powdered di(-chloro-p-xylylene) contained in the quartz tube. As the dimer vapor passed through the pyrolysis zone, it was quantitatively cleaved into two molecules of the reactive intermediate mono(chloro-p-xylylene):

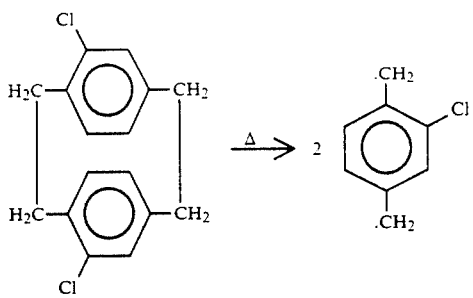

This reactive diradical provided the starting material for the second or intermediate film of glow discharge xylylene (GDX) which was used to promote free radical formation in the bulk GDM film and to provide an adhesive bridge between the GDM and parylene C (Pc) outer insulating film. The GDX layer was polymerized in the presence of the 300 watt, 13 MHz inductively coupled energy source until a GDX film having a thickness of approximately 30 nm was deposited on and/or into the GDM film. The RF energy source was then shut off, allowing the vapor deposition of mono(chloro-p-xylylene) (Pc) to proceed from thermal reactions as is normally the case. Pc film formation continued until the starting dimer material was exhausted and a film thickness of 5-10 microns had been deposited.

Adhesion of the resulting composite film to the substrates was tested using a modification of ASTM standard D3359-83: Method B-Films less than 50 microns. Method B requires that the coated specimens be placed on a firm surface and eleven cuts, 1.0 mm apart, be made in the film. Another set of eleven 1.0 mm cuts was made at 90 degrees to the first set so that a checkerboard network of cuts was produced in the film. The cuts were made with a #10 surgical blade and a specially constructed jig for precise spacing. Tape (provided by 3M Corp.) with an adhesion strength of 44.6 g/mm was placed over the checkerboard grid and within 90 seconds of application removed by rapidly pulling it off at an angle of 180 degrees. Samples were inspected and then subjected to cycles of boiling in saline (one hour each), tape pull test, boiling again, etc. Inspection was done on dry specimens and at the hourly intervals under a binocular microscope. The adhesion was graded from 0B (all squares removed) to 5B (none of the squares detached) in accordance with the aforesaid ASTM standard.

Determinaion of the electrical insulating capabilities of the composite films was made by measuring and monitoring over time the leakage current between interlaced comb patterns made from tantalum and deposited on silicon wafers. The voltage across the combs was continuous at 3 VDC and the current was monitored with a Keithly Model 615 Digital Electrometer. Reservoirs filled with saline were placed over the coated comb structures and, in some cases, the film was scored alongside the comb pattern to provide an entry point for the saline solution.

Shown in FIG. 6 is a scanning electron micrograph (SEM) of a typical cross section of a film which had been subjected to the cyclic tape and boiling test described above for a total period of 15 hours. FIG. 6 indicates that the glow discharge xylylene layer (GDX) provides an interpenetrating network of fibrils extending from or within the GDM layer and terminating in the parylene C layer. This interpenetrating network is shown schematically in FIG. 1.

Figure 7:
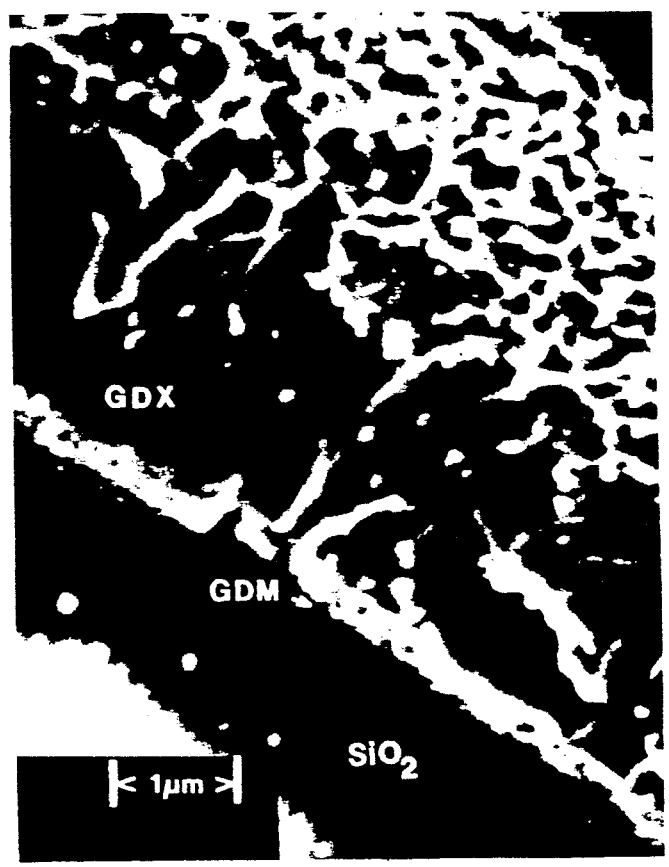
FIG. 7 is a scanning electron microscope (SEM) photomicrograph in cross section of a composite film deposited in accordance with the process of the invention.
Figure 8:
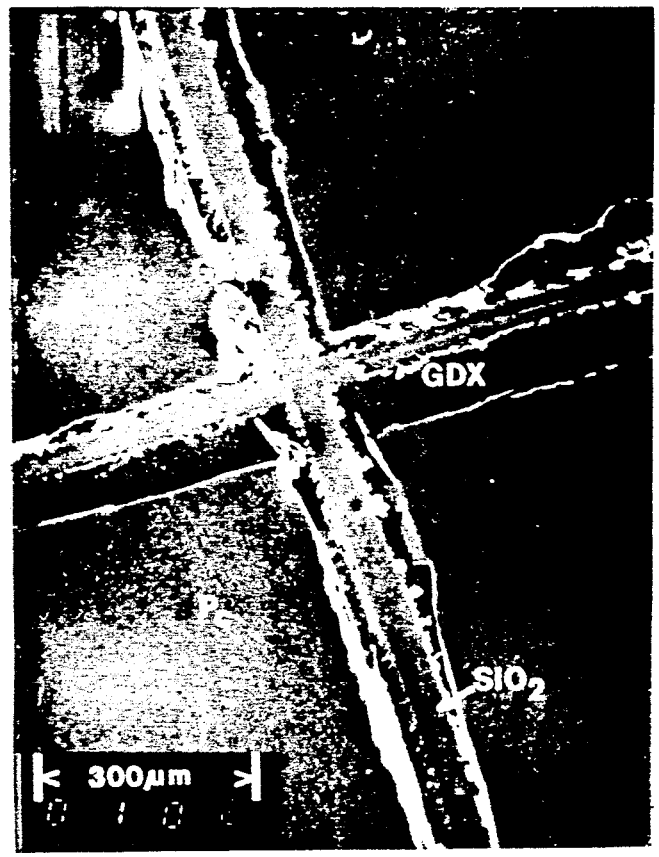
FIG. 8 is an SEM photomicrograph illustrating the manner in which a composite film deposited in accordance with the process of the invention adheres to a substrate after subjection to dry tape testing in accordance with a standard ASTM adhesion test.

Results of the modified ASTM adhesion tests are reflected in the SEMs of FIGS. 7 and 8. FIG. 7 depicts the squares of the film after scribing and shows the respective edges or interfaces of the various layers of the composite film after the initial dry tape test had been performed. It may be seen from this control sample that some tearing of the film occurs as a result of the scoring, but that all edges remain intact, thereby representing a 5B grade. FIG. 8 shows a similar film which had been scored and processed through the alternating pull test-/boiling sequence for 15 hours. Although this scored film had an exposed interface which allowed penetration of the boiling physiological saline solution to reach and disrupt weak secondary bonding forces such as Van der Waals forces, the composite film layers remained intact with each other and the underlying silicon dioxide substrate.

Plotted in FIG. 9 is leakage current data indicative of the effectiveness of the composite films in insulating the comb structures. As indicated by FIG. 9, composite films having adhesion grades of 5B showed no change in leakage current between the combs after 30 days exposure to the voltage and saline stress. One of these combs was scored to provide a potential leakage pathway for the saline solution and thereby test the integrity of the adhesion at the interface. Even in this instance no change in leakage current was shown over the testing interval.

Data for a third preparation as set forth in FIG. 9 reflects the relationship between the graded adhesion scores for the ASTM tape peel test and the insulating ability of the deposited film. In this case, comparative tests were done to determine leakage currents for a batch of combs which had been prepared by vapor deposition of a PC coating directly onto a GDM primer, with no intermediate GDX layer, and whose wet adhesion was grade 2B after subjection to one hour of the alternating boiling/pull test procedure. This sample began to show signs of increased current passage between the combs after the first day of testing and failure as an insulating film by the second day.

All of the samples of FIG. 9 had the same outer coating of parylene C. However, without water insensitive adhesion between the composite layers, the long term insulating ability of the film was compromised.

EXAMPLE 2

Using an apparatus especially adapted for the purpose, leakage current tests were conducted on four tet chips constructed with silicon dioxide coated over polysilicon combs. The estimated thickness of the oxide layer was 200 nanometers. EAch test chip consisted of two polysilicon comb structures with 10 micron spacings between the tines. One comb of each test chip was kept under continuous bias at 5VDC for the duration of the testing period. Before application of a composite insulative coating, the initial leakage currents for each comb structure were less than 1 pA. After cleaning the substrate, a composite coating of GDM, GDX and Pc was applied. The polymerization reactor conditions are shown in Table 1. After the composite coating application, MS1, MS2, and MS3 had leakage currents of less than 1 pA, however, MS4 was elevated to 1.1 pA. The increase in leakage current after coating for MS4 is unexplained at this time.

TABLE 1

Reactor Conditions for Composite Coating on polysilicon Samples

| Sample | GDM W/FM (J/Kg × 10⁹) | GDX W/FM (J/Kg × 10⁹) | Sublimation Temp. (°C.) | Pyrolysis Temp. (°C.) |
|---|---|---|---|---|
| MS1-3 | 56 | 5.72 | 100–105 | 718 |
| MS4 | 56 | 23** | 105–120* | 718 |

*During GDX, sublimation was carefully set to 105° C. for 25 minutes, increased to 110° C. for 11 minutes and finally increased to 120° C. for 18 minutes. Temperature during Parylene C deposition was 105° C.
**Combined methane and xylylene flow during GDX deposition.

In these experiments shown in Table 1 the value of the energy per unit mass parameter, W/FM, for glow discharge methane (GDM) is equivalent to that earlier indicated to be optimal for adhesion to silicon dioxide substrates. The values of W/FM shown in Table 1 for the synthesis of glow discharge xylylene were made to vary in these experiments from approximately $5 \times 10^9$ to $23 \times 10^9$ J/Kg.

Changing the value of W/FM for the glow discharge polymerization of xylylene was restricted because of constraints imposed by the equipment currently available for experiments. In this equipment, the value of W/FM for GDX would normally lie in the range of $6.5 \times 10^9$ J/Kg (+/−5%) when the power level is set at 200 watts and the flow is regulated at 0.30 SCCM (normal conditions for optimal adhesion of GDM to silicon dioxide).

The difference in W/FM values between methane and monochloro-p-xylylene (MCPX) with equivalent flow and power levels is, of course, molecular weight differences. The lowest flow rates in the experimental coating system for MCPX were 0.15 SCCM and the maximum power levels were approximately 300 watts. This resulted in a maximum W/FM value of approximately 19.5, well below the higher optimal values previously found successful for methane. However, by lowering the average molecular weight of the species present in the chamber through mixing the MCPX monomer with another low molecular weight monomer such as methane, an increase was achieved in the value of W/FM.

Transinsulation and transcomb leakage tests on the insulated combs of this example demonstrated that the composite coatings exhibited substantial resistance to electrical breakdown even after exposure to physiological saline for periods of time in excess of 50 days.

EXAMPLE 3

Silicon nitrides were deposited by chemical vapor deposition (CVD) over tantalum comb structures, after which a GDM/GDX/Pc composite film coating was applied thereover. Prior to the actual coating of the test substrates, samples of CVD Si₃N₄ were coated onto silicon wafers. Some of these samples were coated with the composite films and subjected to the adhesion tape test with boiling saline as described in Example 1.

The reactor conditions used for these initial composite film coatings are shown in Table 2. Previous coatings on similar surfaces showed that GDM coating appeared intact after boiling and adhesion testing but separation was taking place between the upper layers of the composite film. These studies were done with W/FM values for the GDX layer at $9 \times 10^9$ J/Kg or at $14 \times 10^9$ J/Kg. It was decided for these experiments that a W/FM value for GDX would be chosen midway between these values at $11-12 \times 10^9$ J/Kg.

TABLE 2

Reactor Conditions for Silicon Nitride Adhesion Tests.

| Run # | GDM (J/Kg × 10⁹) | GDX J/Kg × 10⁹ | Sublimation Temp. °C. | Pyrolysis Temp. °C. |
|---|---|---|---|---|
| GDPC40 | 56 | 11 | 100–110* | 740 |
| GDPC41 | 56 | 12 | 100–110** | 720 |

*During GDX, sublimation temperature was set to 110, otherwise during Pc sublimation temperature was set to 100.
**During GDX, sublimation temperature was set to 100, otherwise during Pc sublimation temperature was set to 110. Baffle was placed at end of pyrolysis tube at opening into chamber.

The first experiment, GDPC40 in Table 2, showed improvement in reducing the separation phenomena (75% of the squares of the upper film of Pc/GDX removed). Another experiment, GDPC41 in Table 2, showed even greater improvement. This experiment had provisions for diverting the delivery of the MCPX monomers to the chamber through baffling the monomers as they exited the pyrolysis tube. Also, the feed rate of the material to the chamber was decreased by lowering the sublimation and pyrolysis temperatures. However, this approach still left 50% of the squares detached between layers and 50% intact after boiling and adhesion tests.

It was decided that some other means of free radical formation which would not substantially increase the individual layer thicknesses should be attempted. Argon gas, a non-polymer forming gas, was chosen for this purpose. The reactor conditions and duration of treatment are shown in Table 3.

After coating, each pattern had a saline reservoir attached as described previously and was placed under a constant 3 volt vias for the duration of the experiment.

TABLE 3

Reactor Parameters for Composite Film Deposition on Si₃N₄ Coated Tantalum Comb Structures.

| Time (Min) | Power (Watts | W/FM J/Kg × 10⁹ | Monomer Gas | Treatment |
|---|---|---|---|---|
| 5 | 250 | 28 | Ar | Atomic Interfacial Mixing |
| 10 | 200 | 56 | CH₄ | GDM Bonding |
| 5 | 250 | 28 | Ar | Free Radical Formation |
| 10 | 50 | 2.4 | MCPX | GDX Bonding |
| 5 | 250 | 28 | Ar | Free Radical Formation |
| 1020 | — | — | MCPX | Parylene-C Bonding |

Traninsulation and transcomb leakage tests on the insulated combs of this example reflected substantial resistance to electrical breakdown after exposure to physiological saline for extended periods of time.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

The embodiments of the invention in which an exclusive method or product is claimed are defined as follows:

What is claimed is:

1. An apparatus for deposition of an electrically insulative composite polymeric coating on the surface of a substrate, said apparatus comprising a polymerization chamber, means within the polymerization chamber for support of a substrate, inlet means for delivery of a glow discharge polymerization monomer gas to said polymerization chamber, means for applying a vacuum to said polymerization chamber, inductance coupling coil outside said polymerization chamber for establishing a glow discharge zone within said chamber, whereby a glow discharge polymer primer coating may be applied to said substrate, means outside said polymerization chamber for vaporizing a precursor for a vapor deposition polymer, a pyrolysis chamber having an inlet in communication with said vaporization means, and an outlet in communication with said polymerization chamber, means for heating said vaporized precursor for pyrolysis thereof within said pyrolysis chamber, and means for controlling the temperature of said substrate at a temperature adapted for condensation of a polymer from said pyrolyzed vapor, the respective orientation of said pyrolysis chamber, said outlet from said pyrolysis chamber into said polymerization chamber, said support means, and said inductance coupling coil being such that precursor vaporized by said vaporization means may be deposited either by glow discharge polymerization or vapor deposition polymerization over the primer coating on said substrate.

* * * * *

UNITED STATES PATENT AND TRADEMARK OFFICE
CERTIFICATE OF CORRECTION

PATENT NO. : 5,121,706
DATED : June 16, 1992
INVENTOR(S) : Michael F. Nichols et al.

It is certified that error appears in the above-identified patent and that said Letters Patent is hereby corrected as shown below:

Column 1, line 9, insert the following:

"This Invention was made with government support under Grant No. N01-NS-4-2374 awarded by the Department of Health and Human Services. The government has certain rights in the Invention."

Signed and Sealed this

Twentieth Day of February, 1996

Attest:

Attesting Officer

BRUCE LEHMAN
Commissioner of Patents and Trademarks